(12) United States Patent
Fukazawa et al.

(10) Patent No.: US 6,291,300 B1
(45) Date of Patent: Sep. 18, 2001

(54) MANUFACTURING METHOD OF SEMICONDUCTOR DEVICES

(75) Inventors: Yuji Fukazawa; Kazuo Saki, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/661,442

(22) Filed: Sep. 13, 2000

(30) Foreign Application Priority Data

Sep. 14, 1999 (JP) .................................................. 11-260730

(51) Int. Cl.⁷ .......................... H01L 21/336; H01L 21/76
(52) U.S. Cl. .............................................. 438/296; 438/424
(58) Field of Search ..................................... 438/296, 424

(56) References Cited

U.S. PATENT DOCUMENTS

| | | | |
|---|---|---|---|
| 5,763,315 | * | 6/1998 | Benedict et al. . |
| 5,780,346 | * | 7/1998 | Arghavannni et al. . |
| 5,966,616 | * | 10/1999 | Woerlee . |
| 5,985,735 | * | 11/1999 | Moon et al. . |
| 6,033,970 | * | 3/2000 | Park . |
| 6,093,618 | * | 6/2000 | Chen et al. . |

FOREIGN PATENT DOCUMENTS

| | | |
|---|---|---|
| 11-3936 | 1/1999 | (JP) . |
| 11-45996 | 2/1999 | (JP) . |

* cited by examiner

*Primary Examiner*—John F. Niebling
*Assistant Examiner*—Josetta I. Jones
(74) *Attorney, Agent, or Firm*—Oblon, Spivak, McClelland, Maier & Neustadt P.C.

(57) ABSTRACT

An element isolation method of a semiconductor device comprises the steps of forming an oxide film on a semiconductor substrate; forming a nitride film on the oxide film; forming an isolation trench on the semiconductor device, the isolation trench being formed through the nitride film and oxide film; forming an oxide insulation layer on the semiconductor substrate to fill the isolation trench and cover the nitride film; flattening the surface of the semiconductor substrate to expose the nitride film by removing a surface portion of the oxide insulation layer in the isolation trench and the oxide insulation layer on the nitride film; heating the flattened semiconductor substrate in a nitrogen-containing gas atmosphere under reduced pressure to form an oxynitride film at an interface between an inside wall of the isolation trench and the oxide insulation layer in the isolation trench; and removing the nitride film and the oxide film on the semiconductor substrate.

3 Claims, 4 Drawing Sheets

- 14 CVD OXIDE FILM
- 13 NITRIDE FILM
- 12 OXIDE FILM
- 11 SILICON SUBSTRATE
- 18

15 NITROGEN

MANUFACTURING METHOD OF SEMICONDUCTOR DEVICES

BACKGROUND OF THE INVENTION

1. Field of the Invention

The present invention relates to a manufacturing method of semiconductor devices, in particular to an element isolation method on a substrate in terms of STI (Shallow Trench Isolation) method.

2. Description of the Related Art

In a semiconductor device, on a semiconductor substrate, constituent elements such as a transistor or diode, a capacitor, a resistance or the like are disposed to be electrically isolated from each other, these elements being interconnected with each other through wirings.

Recently, with higher integration and higher speed of the semiconductor devices, there is a strong demand for an improvement in the technique isolating these elements from each other.

In isolating the elements, in view of realizing excellent element characteristics, reliability and circuit performance, it is strongly desired to, while flattening a surface as much as possible, simplifying manufacturing steps and decreasing defect density, make an element isolation distance as small as possible.

The element isolation technique is roughly divided into LOCOS (Local Oxidation of Silicon) method and STI (Shallow Trench Isolation) method.

The LOCOS method where semiconductor substrate surface is selectively oxidized accompanies problems of erosion of an element formation region due to an occurrence of so-called bird's beak and of an occurrence of crystal defects due to an occurrence of local stress during formation of field oxide.

On the contrary, the STI method is advantageous in miniaturization. In specific, after forming a trench in an element isolation region by the RIE (reactive ion etching) method or the like, an oxide film as a filled material is deposited by the CVD (chemical vapor deposition) method for instance. The oxide layer deposited on a portion other than the trench is removed and flattened by use of CMP (chemical mechanical polishing method) to perform the element isolation.

A convnetional STI method will be explained with reference to FIGS. 8 to 11. On a silicon substrate 1, a silicon oxide film 2 and a silicon nitride film 3 are sequentially formed, thereafter by use of lithography technique and dry etching technique, with the silicon nitride film 3 as a protective layer, a silicon isolation trench 8 is formed. Thereafter, by of the CVD method, a second silicon oxide layer 4 is diposited in the silicon isolation trench 8 to fill the trench. The state up to this step is shown in FIG. 8.

Next, as shown in FIG. 9, the silicon oxide layer 4 is flattened by use of the CMP method, thereafter the silicon nitride film 3 that is a protective layer and the first silicon oxide film 2 being removed. Then, the filled silicon oxide layer 4 is thermally treated to form a STI isolation region.

In the conventional STI like the above, in removing the silicon oxide film 2, an etching liquid such as BHF is usually used. However, the etching liquid permeates into an interface between the silicon substrate 1 and the filled silicon oxide layer 4 to result in a rapid etching at the interface. As a result, as shown in FIG. 10, a divot 7 occurs.

A final thermal treatment is performed to densify. However, because of an oxidizing atmosphere, silicon tends to be oxidized, as a result, as shown in FIG. 10, the STI region undergoes changes. That is, the width of the isolation trench 8 (conversion difference) becomes larger to result in a difficulty in miniaturizing.

Further, after forming the isolation region, an impurity (P or B) is introduced in the element formation region to form a transistor. However, as shown in FIG. 11, through the second filled oxide layer 4 from the trench portion, the impurity diffuses to the external to result in a decrease of the impurity concentration.

In order to overcome the aforementioned disadvantages, Japanese Patent Laid-open Application No. HEI 11-3936 discloses an element isolation method for semiconductor devices. In which, on a wall surface of an isolation trench a silicon oxide film is formed by thermal oxidation, or further on the silicon oxide film formed on the wall surface of the trench a silicon nitride film is deposited. Then, a silicon oxide film is deposited on the substrate by the CVD method, further heat treating the entire substrate in a high-pressure atmosphere.

Further, Japanese Patent Laid-open Application No. HEI 11-45996 discloses a method for manufacturing semiconductor devices. In which, a silicon substrate is directly nitrided, or with a silicon nitride film as a mask nitrogen ions are selectively injected into an isolation trench sidewall or a bottom surface thereof, to diffuse nitrogen atoms into the silicon substrate. Due to the action of the nitrogen atoms, channel impurities are suppressed from diffusing into the trench filled oxide layer.

However, when a nitride film is deposited between the filled oxide layer and the silicon substrate, the nitride film, having a tendency of easily trapping charges, is liable to affect electrically adversely on a transistor.

As mentioned above, in the conventional STI, there have been problems that the divot occurs at an upper interface between the silicon substrate and the filled oxide layer and due to the large isolation width the miniaturization becomes difficult. Further, there is a likelihood that the impurity doped after formation of the isolation region goes therethrough to lower the impurity concentration to result in deteriorating element characteristics. When inserting a nitride film between the silicon substrate and the filled oxide layer to overcome these problems, there occurs a new problem that due to the charge trap an electrically adverse influence is caused.

SUMMARY OF THE INVENTION

An object of the present invention, which is performed to solve the aforementioned problems, is to provide an element isolation method of a semiconductor device that can realize high miniaturization and is excellent in electrical reliability.

The element isolation method of the present invention is characterized in that an oxynitride film is formed at an interface between a substrate and a filled oxide film.

A first method for manufacturing a semiconductor device of the present invention comprises the steps of forming an oxide film on a semiconductor substrate; forming a nitride film on the oxide film; forming an isolation trench on the semiconductor device, the isolation trench being formed through the nitride film and oxide film; forming an oxide insulation layer on the semiconductor substrate to fill the isolation trench and cover the nitride film; flattening the surface of the semiconductor substrate to expose the nitride film by removing a surface portion of the oxide insulation layer in the isolation trench and the oxide insulation layer on the nitride film; heating the flattened semiconductor substrate in a nitrogen-containing gas atmosphere under reduced pressure to form an oxy-nitride film at an interface between an inside wall of the isolation trench and the oxide insulation layer in the isolation trench; and removing the nitride film and the oxide film on the semiconductor substrate.

A second method for manufacturing a semiconductor device of the present invention comprises the steps of forming a first oxide film on a semiconductor substrate; forming a nitride film on the first oxide film; forming an isolation trench on the semiconductor substrate, the isolation trench being formed through the nitride film and first oxide film; forming a second oxide layer on a surface of the isolation trench; heating the semiconductor substrate having the isolation trench in a nitrogen-containing gas atmosphere under reduced pressure to form an oxy-nitride film on a surface of the isolation trench; forming an oxide insulation layer on the semiconductor substrate to fill the isolation trench and cover the nitride film; flattening a surface of the semiconductor substrate by removing a surface portion of the oxide insulation layer in the isolation trench and the oxide insulation layer on the nitride film; and removing the nitride film and the first oxide film on the semiconductor substrate.

In the method for manufacturing a semiconductor device of the present invention, an oxynitride film is formed due to an introduction of nitrogen into an interface between the isolation trench and the oxide insulating layer. Alternatively, an oxynitride film is formed on the surface of the formed isolation trench. In both cases, the thermal treatment is performed in an atmosphere of nitrogen containing gas selected from a group consisting of NO, $N_2O$, $NO_2$ and $NH_3$. Preferably, when heat treating is performed in NO or $N_2O$ gas containing atmosphere, an oxynitride film, which has nitrogen concentration peak at the neighborhood of the interface between the isolation trench and the oxide isolating layer, is formed.

Further, heating is performed in an atmosphere of reduced pressure such as for instance approximately 4 Torr to 400 Torr. In that case, at the interface between the isolation trench of the silicon substrate and the filled oxide insulating layer, nitrogen concentrates to form a preferable oxynitride film.

The oxynitride film, being low in an etching rate by HF or the like compared with that of the oxide film, can suppress an abnormal etching (occurrence of divot) from occurring at the interface between the trench and the insulating layer. As a result, a isolation region having a flat surface can be formed.

Further, the oxynitride film is dense in its structure and excellent in its barrier characteristics. Accordingly, after formation of the element isolation trench, when being thermally treated even in an oxidizing gas atmosphere, the oxynitride film protects the silicon thereunder from being oxidized. As a result, the aforementioned not intended dimensional error such as the trench width change due to the thermal treatment (occurrence of conversion difference), can be prevented from occurring to result in realization of an accurate miniaturization.

Further, after the STI processing, when forming a transistor, on the silicon substrate of an element region located between an element isolation region and an element isolation region the impurities such as boron (B), phosphorus (P) or the like are doped. In that case, the oxynitride film blocks diffusion of these impurities to result in preventing concentration from varying due to the diffusion of impurities.

Further, the step of heating the substrate in a nitrogen-containing gas atmosphere of the present invention alternates with the step of densifying after the CVD depositing. Accordingly, the number of the steps can be decreased to result in a realization of low costs.

BRIEF DESCRIPTION OF THE PREFERRED EMBODIMENTS

In the following, with reference to the drawings, embodiments of the present invention will be explained.

Embodiment 1

On a silicon semiconductor substrate 11, in terms of thermal oxidation a silicon oxide film 12 of a thickness of approximately 50 nm is formed as an insulating layer, further thereon in terms of the CVD method a silicon nitride film 13 of a thickness of approximately 150 nm being deposited.

In that case, the silicon nitride film 13 and the silicon oxide film 12, by the lithography technique and dry etching technique, are patterned into a desired trench shape.

Next, with the patterned silicon nitride film 13 as a protective layer, the silicon of the substrate 11 is dry etched to form a trench 18 of a width of approximately 0.5 μm and a depth of approximately 0.2 to 0.4 μm. The etching here is performed by, for instance, the reactive ion etching (RIE).

Figure 1:
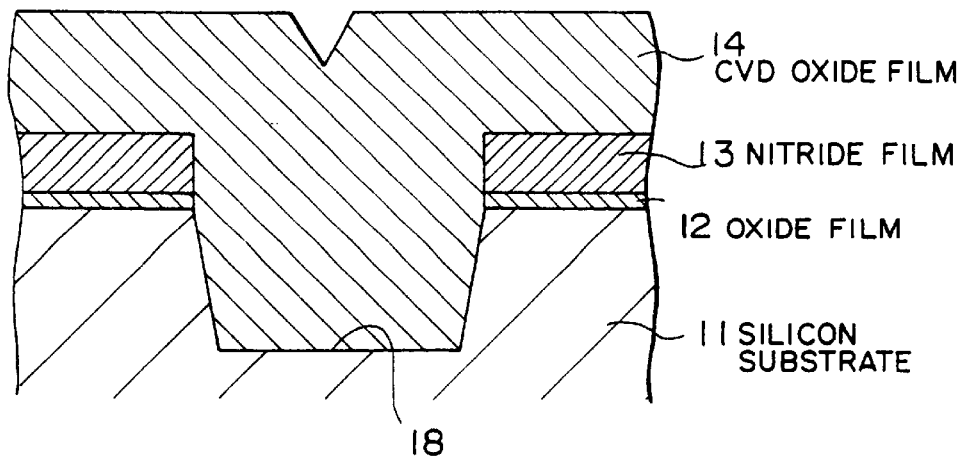
FIG. 1 is a sectional view showing one step in a first element isolation method of a semiconductor device of the present invention.

Further, by using the CVD method, as a filled insulator of the STI (shallow trench isolation) a second silicon oxide layer 14 is deposited. The state up to here is shown in FIG. 1. The silicon oxide layer 14 is deposited to fill the trench 18 and to cover the silicon nitride film 13.

When the silicon oxide layer is used for the filled insulator, as gas material for CVD, as inorganic starting materials, silicon tetrachloride (SiCl$_4$), dichlorosilane (SiH$_2$Cl$_2$), mono-silane (SiH$_4$) or the like can be used. From these gases, a HTO (High Temperature Oxide) film that can be formed at a high temperature (approximately 750 to 900° C.) and a LTO (Low Temperature Oxide) film that can be formed at a low temperature (approximately 400° C.) are formed depending on necessary properties.

Further, as an organic starting gas for CVD silicon oxide layer, tetraethoxysilane TEOS [Si(OC$_2$H$_5$)$_4$], tetramethoxysilane TMOS [Si(OCH$_3$)$_4$], tetrapropoxysilane TPOS [Si(OC$_3$H$_7$)$_4$], diacetoxyditertiarybutoxysilane DADBS [Si(CH$_3$COO)$_2$(C$_4$H$_9$O)$_2$] or the like can be used. With these organic gases as the CVD material, a silicon oxide layer also can be formed.

Furthermore, not only the aforementioned silicon oxides but also phosphosilicate glass PSG [(SiO$_2$)$_x$(P$_2$O$_5$)$_{1-x}$], borosilicate glass BSG [(SiO$_2$)$_x$(B$_2$O$_3$)$_{1-x}$] and borophosphosilicate glass BPSG [(SiO$_2$)$_x$(P$_2$O$_5$·B$_2$O$_3$)$_{1-x}$] can be used as demands arise.

As the CVD methods that can be used, atmospheric pressure CVD method, low pressure CVD method, plasma CVD method, photo CVD method, liquid phase CVD method or the like can be cited.

In the atmospheric pressure and low pressure CVD methods, ozone CVD method where O$_2$ is introduced in an ozonizer to form ozone (O$_3$) due to discharge can be used. In the low pressure CVD method, for instance, TEOS and ozone O$_3$ are allowed to react under a reduced pressure of approximately 6.7 kPa to deposit a silicon oxide layer.

The deposition of an oxide layer by the plasma CVD can be performed by use of plasma discharge at for instance 13.56 MHz or approximately 150 kHz with gas sources such as TEOS, O$_2$, He or the like.

In the deposition of an oxide layer by the photo CVD, light energy of mainly ultra-violet light is used to cause a photoreaction. The light energy of mainly ultra-violet light can be obtained from excimer lasers such as ArF (wavelength; 193 nm), KrF (wavelength; 249 nm), XeCl (wavelength; 308 nm), XeF (wavelength; 350 nm) or the like, high pressure mercury lamp and mercury-xenon lamp.

The deposition by the liquid phase CVD method, with for instance O$_2$ excited due to RF discharge and TMS (tetramethylsilane), is performed at −40° C.

The aforementioned CVDs are performed in a gas of for instance reductive gases such as H$_2$ or the like, inert gases such as He, Ne, Ar, Kr and Xe, O$_2$, N$_2$, HCl, CO or CO$_2$, or in a gas mixture of two kinds or more of the gases selected therefrom.

Figure 2:
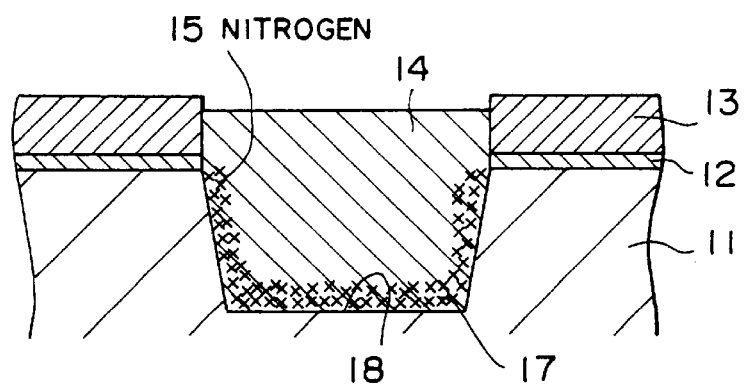
FIG. 2 is a sectional view showing one step in a first element isolation method of a semiconductor device of the present invention.

Next, as shown in FIG. 2, by use of CMP technique, the flattening is implemented to expose the silicon nitride protective film 13. The flattening is performed by, for instance, the CMP (chemical mechanical polishing).

After the flattening, with BHF (a liquid mixture of HF and NH$_4$F), the oxide portion of the trench is adjusted in the height thereof.

Next, in a reduced pressure NO gas atmosphere of approximately 400 Torr, thermal treatment is performed at a temperature of 750° C. for 60 min. The step of oxynitridation is performed under the process conditions of NO/N$_2$ gas ratio of 1/9 slm, 15 minutes at a concentration of 1.0×10$^{14}$ atom/cm$^2$, 30 minutes at a concentration of 1.6×10$^{14}$ atom/cm$^2$ and 15 minutes at a concentration of 1.8×10$^{14}$ atom/cm$^2$.

Figure 3:
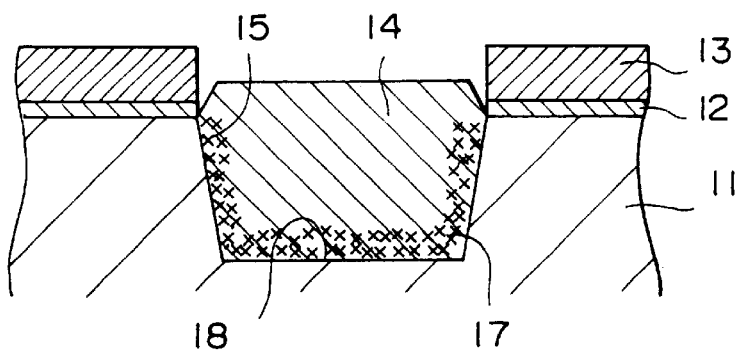
FIG. 3 is a sectional view showing one step in a first element isolation method of a semiconductor device of the present invention.

Due to the nitridation, in the neighborhood of the interface between the oxide layer 14 in the trench 18 and the silicon substrate 1 nitrogen 15 is introduced to form, as shown in FIG. 3, an oxynitride film nearly equal to nitride film. In particular, at the interface between the silicon 1 and the oxide layer 14, high concentration nitrogen 15 is trapped.

Figure 4:
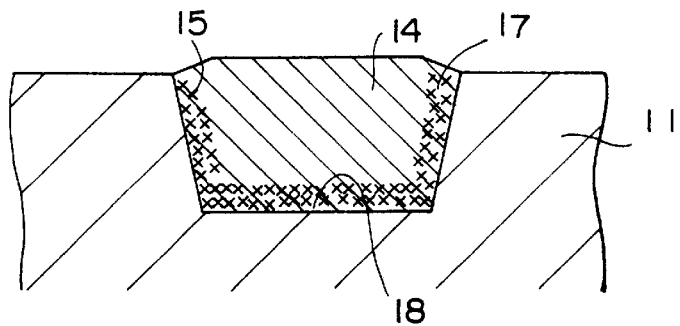
FIG. 4 is a sectional view showing one step in a first element isolation method of a semiconductor device of the present invention.

Thereafter, as shown in FIG. 4, the silicon nitride film 13 and silicon oxide film 12 are removed and further by BHF etching the STI shape is adjusted. The etching rate by BHF of the oxynitride film of the portion that is oxynitrided due to the thermal oxynitridation becomes smaller than that of the oxide film. The degree thereof can be adjusted through the conditions of the thermal oxynitridation.

In the aforementioned thermal oxynitridation, NO gas is used. However, other than the NO gas, with nitrogen oxides uch as NO$_2$, N$_2$O or the like and other gases such as NH$_3$ gas or the like, or a gas mixture thereof, the thermal oxynitridation can be similarly performed.

Embodiment 2

Figure 5:
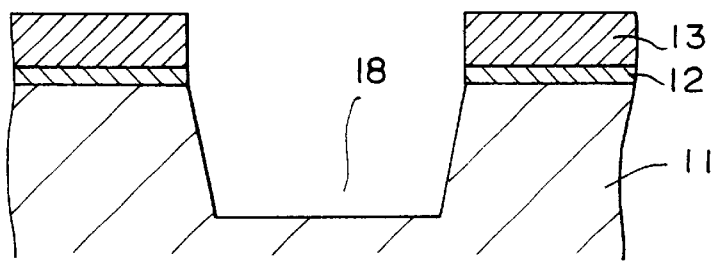
FIG. 5 is a sectional view showing one step in a second element isolation method of a semiconductor device of the present invention.

Similarly with Embodiment 1, as shown in FIG. 5, a trench 18 provided with a silicon oxide film 12 that is a first oxide film and a silicon nitride protective film 13 is formed.

Figure 6:
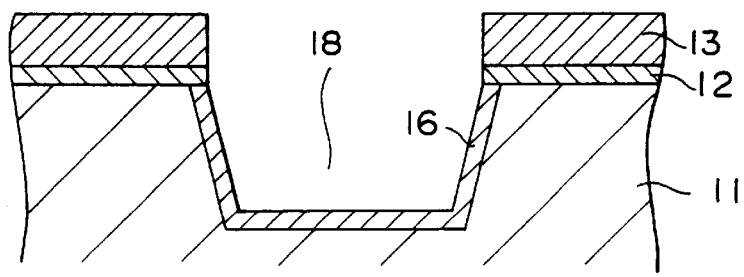
FIG. 6 is a sectional view showing one step in a second element isolation method of a semiconductor device of the present invention.

Next, as shown in FIG. 6, on the inner wall of the trench, a thermal oxide film 16 of a thickness of approximately 5 nm is formed.

Figure 7:
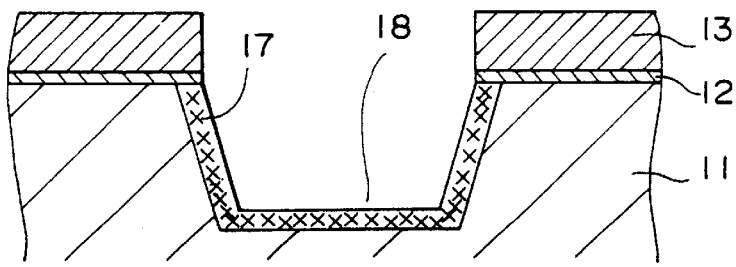
FIG. 7 is a sectional view showing one step in a second element isolation method of a semiconductor device of the present invention.
Figure 8:
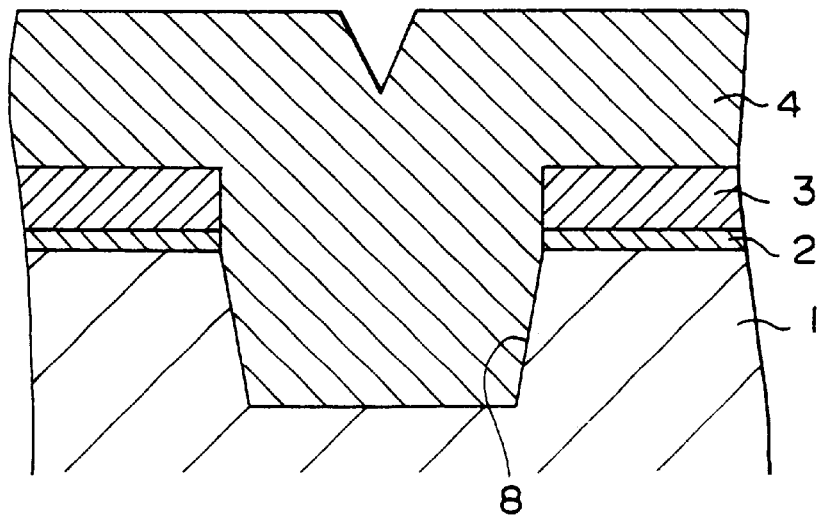
FIG. 8 is a sectional view showing one step of a conventional element isolation method of a semiconductor device.
Figure 9:
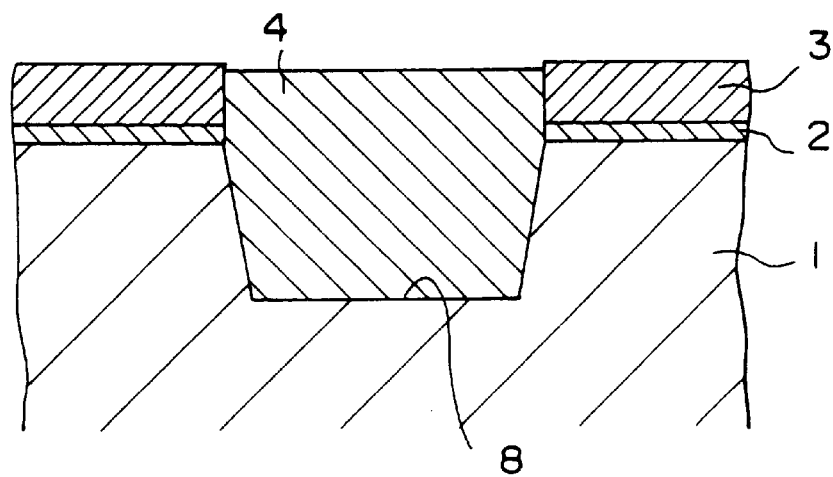
FIG. 9 is a sectional view showing one step of a conventional element isolation method of a semiconductor device.
Figure 10:
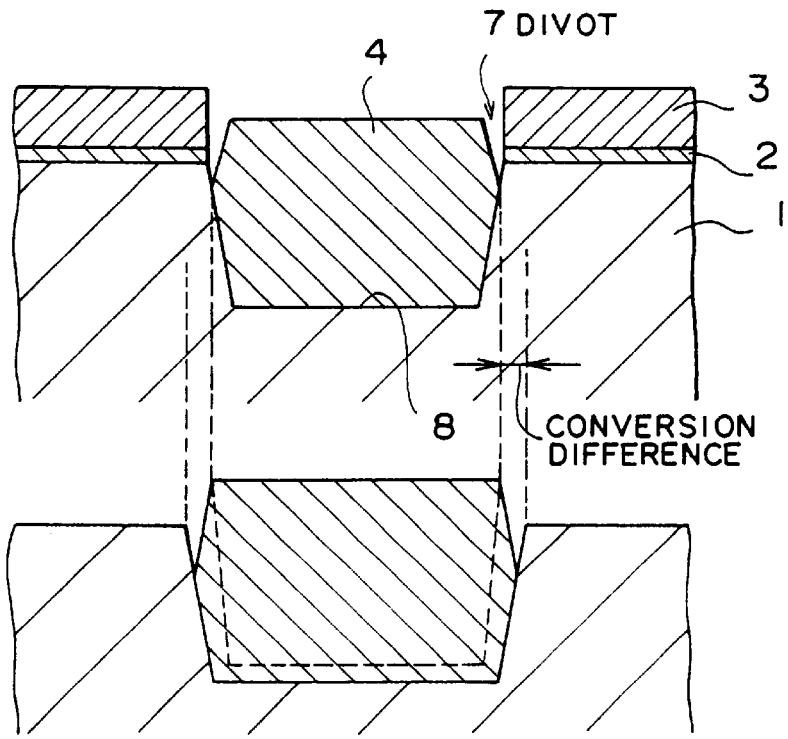
FIG. 10 is a sectional view showing one step of a conventional element isolation method of a semiconductor device.
Figure 11:
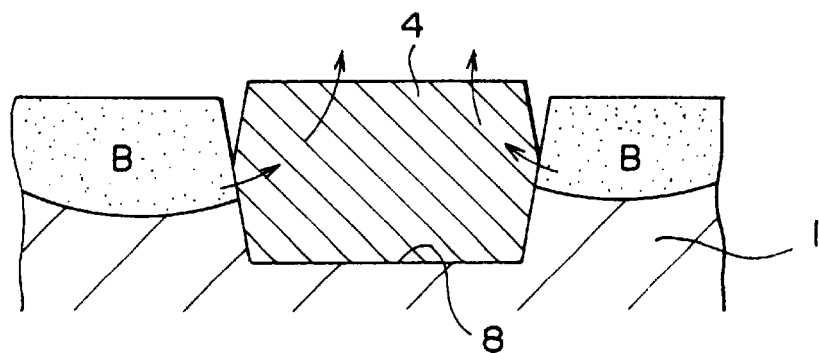
FIG. 11 is a sectional view showing one step of a conventional element isolation method of a semiconductor device.

Later, as shown in FIG. 7, the oxynitridation is performed at approximately 800° C. in an NO gas containing atmosphere under a reduced pressure of 4 Torr to deposit an oxynitride film 17. The process conditions for the oxynitridation are as follows. The NO/N$_2$O gas ratio is 1/9 slm, 15 minutes at a concentration of 1.0×10$^{14}$ atom/cm$^2$, 30 minutes at a concentration of 1.6×10$^{14}$ atom/cm$^2$ and 15 minutes at a concentration of 1.8×10$^{14}$ atom/cm$^2$.

Thereafter, though not shown in particular in the drawing, a CVD oxide film is filled as an insulating layer to implement trench element isolation similarly with embodiment 1.

Instead of the NO gas, nitrogen oxide gases such as NO$_2$ N$_2$O or the like and other gases such as NH$_3$ or the like, or a combination thereof may be used. Further, the oxynitridation with these gases may be performed, without through the thermal oxide film 16, directly on a surface of the trench silicon.

In all of the aforementioned embodiments, due to the thermal treatment, the oxynitride film 17 is formed on an inner wall surface of the trench. However, after formation of the silicon trench, by depositing the oxynitride film by the plasma processing, a similar effect can be expected.

According to the present element isolation method of a semiconductor device, the oxynitride film, being low in the etching rate by HF compared with that of the oxide film, can suppress abnormal etching, namely divots, from occurring at an interface between the silicon in the element formation region and the insulator filled in the element isolation trench. Thereby, an isolation region of flat surface can be formed. Similarly, the oxynitride film, being dense in structure and excellent in barrier characteristic, can protect the silicon substrate from being oxidized to form the isolation region with accuracy. Further, even after the formation of the element isolation region, the oxynitride film can effectively block the doped impurities from diffusing into the element isolation region.

Further, according to the present invention, the formation of the oxynitride film at an interface between the inner wall of the trench and the filled oxide insulating layer is performed by heating in an atmosphere including nitrogen of reduced pressure of less than 1 atm. Accordingly, the oxynitride film can be efficiently and intensively formed at the interface.

Thus, according to the element isolation method of the present invention, high miniaturization and excellent electrical reliability can be realized at low costs and with simplicity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming an oxide film on a semiconductor substrate;

forming a nitride film on the oxide film;

forming an isolation trench on the semiconductor device, the isolation trench being formed through the nitride film and oxide film;

forming an oxide insulation layer on the semiconductor substrate to fill the isolation trench and cover the nitride film;

flattening the surface of the semiconductor substrate to expose the nitride film by removing a surface portion of the oxide insulation layer in the isolation trench and the oxide insulation layer on the nitride film;

heating the flattened semiconductor substrate in a nitrogen-containing gas atmosphere under reduced pressure to form an oxy-nitride film at an interface between an inside wall of the isolation trench and the oxide insulation layer in the isolation trench; and removing the nitride film and the oxide film on the semiconductor substrate.

2. The method for manufacturing a semiconductor device according to claim 1, wherein the nitrogen containing gas atmosphere comprises at least one selected from the group consisting of NO, $N_2O$, $NO_2$ and $NH_3$.

3. The method for manufacturing a semiconductor device according to claim 1, wherein the reduced pressure of the nitrogen-containing atmosphere is less than 1 atm.

* * * * *